United States Patent [19]
West

[11] Patent Number: 4,550,405
[45] Date of Patent: Oct. 29, 1985

[54] DESKEW CIRCUIT FOR AUTOMATIC TEST EQUIPMENT

[75] Inventor: Burnell G. West, Fremont, Calif.

[73] Assignee: Fairchild Camera and Instrument Corporation, San Jose, Calif.

[21] Appl. No.: 452,608

[22] Filed: Dec. 23, 1982

[51] Int. Cl.[4] .............................................. H03K 5/00
[52] U.S. Cl. ......................................... 371/1; 328/140
[58] Field of Search .................. 371/1, 61; 360/6, 51; 340/347 AD, 347 DA; 328/140, 138

[56] References Cited

U.S. PATENT DOCUMENTS

| | | | |
|---|---|---|---|
| 3,456,237 | 8/1965 | Collins | 371/1 |
| 3,921,212 | 11/1975 | Gray | 360/51 |
| 3,925,604 | 12/1975 | Bliss | 360/6 |
| 4,103,234 | 7/1978 | Frazier | 340/347 AD |
| 4,218,770 | 8/1980 | Weller | 371/61 |

Primary Examiner—Michael R. Fleming
Attorney, Agent, or Firm—Theodore S. Park; Robert C. Colwell

[57] ABSTRACT

An electrical pulse edge timing adjustment circuit 10 comprising one or more deskew elements 5. In each deskew element, a pulse train is passed through an inverter 20. The falling rate of pulse edges on the inverter output line 21 is controlled by a capacitor 24 and an adjustable current sink 25 which determine the output line capacitance discharge rate. From the output line, pulses are passed to another deskew element which re-inverts the pulses and delays the formerly rising pulse edges. Each current sink is independently adjustable to allow different delays in the rising and falling edges.

13 Claims, 1 Drawing Figure

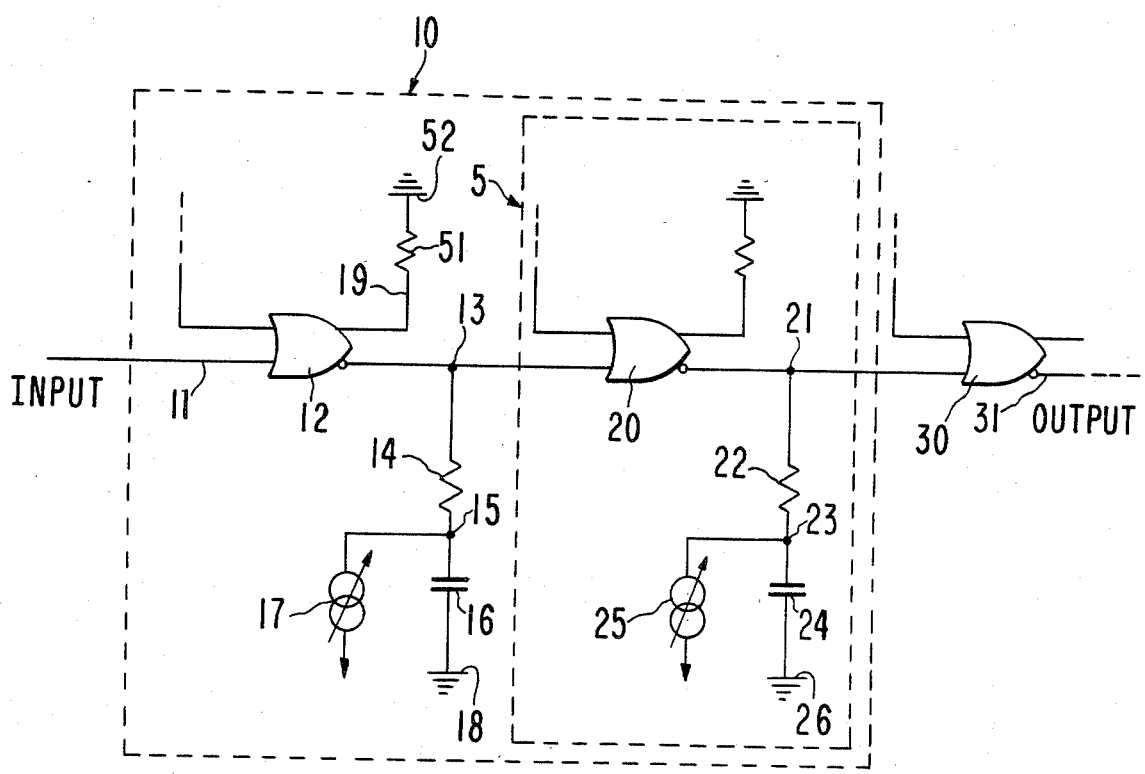

DESKEW CIRCUIT FOR AUTOMATIC TEST EQUIPMENT

BACKGROUND OF THE INVENTION

1. Field of the Invention

This invention relates to an electrical pulse timing deskew circuit with independently variable rising and falling pulse edge delays, and particularly to a deskew circuit for Emitter Coupled Logic (ECL) circuits used in automatic test equipment.

2. Description of the Prior Art

Test systems for integrated circuits (IC's) must determine, among other things, whether the IC being tested meets timing specifications. For this purpose it is desirable to synchronously apply pulses to the input pins of an IC, and detect the resultant output signals. It is not generally possible to build multiple test system circuits each having little enough pulse timing variation to produce signal patterns with all pulse edges from all circuits precisely aligned across the IC input pins. Accordingly, the time difference, or "skew" of each pulse relative to a reference time, must be measured and corrected to assure that the IC is properly tested and the results correctly interpreted. Although in some applications it is necessary to adjust only the leading edge or only the trailing edge, both edges must be independently adjustable to provide patterns to test all aspects of many IC's.

One prior art technique for deskewing signals employed adjustable capacitors in the signal path. This technique required manual adjustment of each capacitor, and was therefore undesirably time consuming. Another technique, disclosed in copending commonly assigned U.S. patent application Ser. No. 365,829 filed Apr. 5, 1982, uses a variable delay line having multiple taps. The signal delay varies in proportion to the path length to the selected tap. Because the tapped delay line is relatively costly, there is a need for a more economical deskew circuit.

SUMMARY OF THE INVENTION

The invention employs a series of delay circuits, each circuit comprising an inverter and a network including a resistor, a capacitor, and a variable current source, all connected to the output line of the inverter, to control the current pulled from the inverter output line and thus the falling rate of an output pulse. Rising pulse edges are delayed in a subsequent circuit by inverting the signal and processing it in a similar manner. The original rising edge, after being inverted and processed as a falling edge, is reinverted. A pair of such delay circuits comprises a stage 10. If the leading edge of a short pulse were delayed too much, it could overlap the trailing edge and destroy the pulse. Therefore, successive stages may be used to successively delay pulses for a longer total time.

BRIEF DESCRIPTION OF THE FIGURE

The FIGURE shows a pair of deskew elements which together form a stage, and an output inverter.

DETAILED DESCRIPTION OF THE PREFERRED EMBODIMENT

The circuit in the FIGURE includes an input line 11 which receives pulse signals for processing through delay stage 10 to be ultimately supplied on output line 31. Delay stage 10 includes a pair of deskew elements 5, each of which inverts pulses and delays their falling edges. Delay stage 10 may be followed by additional duplicate delay stages if it is desired to further delay the pulse on line 11. The final delay stage is followed by a logic device 30 to restore the square wave shape of the pulse train for output on line 31. In the preferred embodiment, the inverters used are OR gates such as gates 12 and 20 with inverted and noninverted outputs. AND gates with both outputs or a series of inverters could also be used.

The output lines of ECL gates are transistor emitters. Depending on the logic state of the gate, the switching process pulls the base of the transistor to either a high or a low voltage. An output transistor switches on when a high level voltage is applied to its base, which immediately raises the voltage of the emitter and output line. However, when the transistor is switched off by changing the voltage on the base to a low level, the voltage of the emitter and output line will drop at a rate depending on the rate at which charge is pulled from the emitter by external circuitry. Thus, the emitter voltage does not necessarily decrease as fast as it increases.

In the invention, the falling rate of the pulse edge from gate 12 can be controlled by the variable direct current sink 17 without substantially affecting the rising rate of the pulses. Current sink 17 always pulls against gate 12. The current sink is a high DC impedance load but offers essentially no AC impedance. Capacitor 16 is selected according to the switching rate desired, and in the preferred embodiment is 20 picofarads with a time constant on the order of magnitude of one nanosecond. This is about the switching speed of ECL transistors and thus is a comparatively long time. Capacitor 16 has a negligible effect on rising pulses because while the capacitor is charging, the increased voltage remains essentially across resistor 14. Resistor 14 provides the appropriate impedance, 51 ohms in the preferred embodiment, between output line 13 and current sink 17.

During the envelope of a pulse, capacitor 16 charges to the voltage level at node 15, which is almost the voltage at gate output line 13. There is a slight voltage drop across resistor 14 due to the current, preferably one to ten milliamps, that is always being pulled through it by current sink 17. When gate 12 switches off, the voltage at node 15 and thus at node 13 is immediately lowered by current sink 17 to the voltage on capacitor 16. The voltage at node 13 continues to drop as capacitor 16 discharges at a rate determined by its capacitance versus the current flow through adjustable sink 17. When the voltage across capacitor 16 crosses the turnoff threshold for succeeding gate 20, a falling edge is propagated by gate 20. The pulse train is inverted by gate 20 at its output node 21. At this point, the originally rising, and thus far not delayed, pulse edges become falling edges, and are delayed by the network around node 23 in the same manner as just described for node 15, but independently of the length of delay after gate 12 because current sink 25 is adjustable independently of any other current sink.

The pair of gates 12 and 20 together comprise one delay stage which can independently shift either or both edges of a pulse. Delay stage 10 is suitable for use in series with other identical stages 10 connected at its input and output. Serially connecting the stages allows a leading edge to be delayed more than the total width of a pulse. In stage 10 and each successive stage the inverting outputs of the gates are used, because pulses must be inverted between each gate. The non-inverting outputs are not used, but, for proper gate operation, are connected to ground 52 through an appropriate impedance such as 51 ohm resistor 51. The pulse train does not need to be inverted before the first deskew element in a series of stages. Thus, if line 11 is the initial input, node 13 may be connected to non-inverting output 19 and the inverted output of gate 12 grounded.

In a train of relatively narrow positive pulses, that is, where the duration of high level voltages is generally less than the duration of low level voltages, delaying falling edges first has the useful effect of widening the narrow part of the pulse, and vice-versa, between edge delays. Because the passing of the gate 20 threshold voltage at node 13 is delayed by capacitor 16 lowering the voltage at that point, the shape of the falling pulse edge is changed from a down-step to a gradual slope. A final logic element such as gate 30, without a corresponding delay network is needed to restore the square wave shape of the pulse train. There will be an even total number of inversions for the pulse train if the output is to be non-inverted.

Details have been disclosed to illustrate the invention in a preferred embodiment of which adaptions and modifications within the spirit and scope of the invention will occur to those skilled in the art. The scope of the invention is limited only by the following claims.

I claim:

1. A circuit for delaying signals having voltage transitions comprising:
    an input node to which the signals are supplied;
    an intermediate output node;
    a reference potential source;
    interconnecting means coupled between the input node and the intermediate output node, the interconnecting means having a high output impedance for voltage transitions in a first direction, and a low output impedance for voltage transitions in an opposite direction;
    a capacitor connected between the reference potential source and the intermediate output node; and
    means, coupled to the capacitor, for discharging the capacitor at a controlled rate when voltage transitions are in the first direction and charging the capacitor when voltage transitions are in the opposite direction.

2. A circuit as in claim 1 wherein the interconnecting means comprises a logic gate.

3. A circuit as in claim 2 wherein the logic gate comprises an emitter coupled logic gate.

4. A circuit as in claim 3 wherein the logic gate inverts signals supplied to the input node before supplying those signals to the intermediate output node.

5. A circuit as in claim 1 wherein the means for discharging the capacitor comprises a controllable current sink.

6. A circuit as in claim 5 further comprising a resistor coupled between the capacitor and the intermediate output node.

7. A circuit as in claim 6 wherein the controllable current sink is connected between the resistor and the capacitor.

8. A circuit as in claim 1 wherein the interconnecting means comprises an inverter for inverting the signals supplied to the input node.

9. A circuit as in claim 8 further comprising:
    an output node;
    a second reference potential source;
    second interconnecting means coupled between the intermediate output node and the output node and having a high output impedance for voltage transitions in a first direction, and a low output impedance for voltage transitions in an opposite direction;
    a second capacitor connected between the output node and the second reference potential source; and
    second means, coupled to the second capacitor, for discharging the second capacitor at a controlled rate when voltage transitions are in the first direction and charging the capacitor when voltage transitions are in the opposite direction.

10. A circuit as in claim 9 wherein:
    the second means for discharging the second capacitor comprises a second controllable current sink; and
    wherein a second resistor is coupled between the second capacitor and the output node.

11. A circuit for delaying a pulse supplied at an input node comprising:
    an intermediate node;
    an output node;
    a first reference potential souce;
    a second reference potential source;
    first interconnecting means coupled between the input node and the intermediate node, the first interconnecting means having a high output impedance for voltage transitions in a first direction and a low output impedance for voltage transitions in an opposite direction;
    second interconnecting means for inverting signals supplied it coupled between the intermediate node and the output node, the second interconnecting means having a high output impedance for voltage transitions in a first direction, and a low output impedance for voltage transitions in an opposite direction;
    a first capacitor connected between the first reference potential source and the intermediate node;
    a second capacitor connected between the second reference potential source and the output node;
    a first resistor coupled between the intermediate node and the first capacitor;
    a second resistor coupled between the output node and the second capacitor;
    a first controllable current sink connected between the first capacitor and the first resistor for discharging the first capacitor at a controlled rate when voltage transitions are in the first direction and charging the capacitor when voltage transitions are in the opposite direction; and
    a second controllable current sink connected between the second capacitor and the second resistor, for discharging the second capacitor at a controlled rate when voltage transitions are in the first direction and charging the capacitor when voltage transitions are in the opposite direction.

12. A circuit as in claim 11 wherein each of the first and second interconnecting means comprises an emitter coupled inverter.

13. A circuit as in claim 12 wherein each of the first and second reference potential sources comprises a source of ground potential.

* * * * *